(12) United States Patent
Chen et al.

(10) Patent No.: US 10,984,524 B2
(45) Date of Patent: Apr. 20, 2021

(54) CALIBRATION SYSTEM WITH AT LEAST ONE CAMERA AND METHOD THEREOF

(71) Applicant: Advanced Ion Beam Technology, Inc., Hsinchu (TW)

(72) Inventors: Chien-Li Chen, Tainan (TW); Yu-Ho Ni, Tainan (TW); Chien-Cheng Kuo, Tainan (TW); Te-min Wang, Tainan (TW)

(73) Assignee: ADVANCED ION BEAM TECHNOLOGY, INC., Hsinchu (TW)

(*) Notice: Subject to any disclaimer, the term of this patent is extended or adjusted under 35 U.S.C. 154(b) by 0 days.

(21) Appl. No.: 16/185,133

(22) Filed: Nov. 9, 2018

(65) Prior Publication Data

US 2019/0197675 A1 Jun. 27, 2019

Related U.S. Application Data

(60) Provisional application No. 62/608,817, filed on Dec. 21, 2017.

(51) Int. Cl.
*G06T 7/00* (2017.01)
*G06T 7/73* (2017.01)
*H01L 21/68* (2006.01)

(52) U.S. Cl.
CPC ............ *G06T 7/001* (2013.01); *G06T 7/74* (2017.01); *H01L 21/681* (2013.01); *G06T 2207/30164* (2013.01)

(58) Field of Classification Search
CPC .. G06T 7/001; G06T 7/74; G06T 2207/30164; H01L 21/681
USPC .......................................................... 348/95
See application file for complete search history.

(56) References Cited

U.S. PATENT DOCUMENTS

| 10,334,239 | B2* | 6/2019 | Yoshioka | H04N 17/002 |
| 2004/0075879 | A1* | 4/2004 | Karin | G01N 21/956 |
| | | | | 359/196.1 |
| 2006/0190916 | A1* | 8/2006 | Pike | H01L 21/67253 |
| | | | | 716/55 |
| 2008/0077271 | A1* | 3/2008 | Sundar | H01L 21/68707 |
| | | | | 700/218 |
| 2009/0175530 | A1* | 7/2009 | Sjostrom | G01N 21/956 |
| | | | | 382/152 |
| 2010/0248398 | A1* | 9/2010 | Wang | H01L 21/6831 |
| | | | | 438/14 |
| 2016/0116419 | A1* | 4/2016 | Pavani | G01N 21/9501 |
| | | | | 348/87 |
| 2017/0339335 | A1* | 11/2017 | Kuokkanen | H04N 5/2256 |

* cited by examiner

*Primary Examiner* — Michael Lee
(74) *Attorney, Agent, or Firm* — WPAT, PC

(57) ABSTRACT

A method for calibrating element in a semiconductor processing device with a camera is provided. The method for calibrating element in a semiconductor processing device with a camera includes taking a first picture of a first element by a camera; providing a first actuator to move the first element an increment along a first direction; taking a second picture of the first element by the camera; and comparing the first picture and the second picture to calibrate the first element. A system for calibrating element in a semiconductor processing device with a camera is also provided.

29 Claims, 7 Drawing Sheets

CALIBRATION SYSTEM WITH AT LEAST ONE CAMERA AND METHOD THEREOF

BACKGROUND OF INVENTION

The present invention is related to a calibration system and method, and more particularly to a calibration system and method with a camera.

In semiconductor processing, the dimension of circuit is more and more scaling down, and the requirement of precision of the production equipment is higher and higher. In order to improve the quality of integral circuit and accuracy of the semiconductor process, the positioning of each component inside the production equipment must be very precise. U.S. Pat. No. 6,633,046 B1 disclosed a method and apparatus for detecting that two moveable members are correctly positioned relatively to one another. U.S. Pat. No. 8,519,363 B2 disclosed a wafer handling method and an ion implanter that are capable of accurately adjusting a twist angle of a wafer to a target twist angle given as one of ion implantation conditions. Although the methods of adjusting is announced, but these methods are still too cumbersome and require manual operations for calibration. However, with the miniaturization of circuit of the semiconductor manufacturing process, the precision requirements of the machine have exceeded the limits of manual operation. Therefore, there is a need for a simpler and more accurate calibration method.

SUMMARY OF THE INVENTION

The present invention provides a calibration system and method, and more particularly to a calibration system and method with one or more cameras under either atmosphere or vacuum condition. The present invention provides a calibration system and method simpler and more accurate. And provide high accuracy of positioning in vacuum and automatic positioning.

The method for calibrating element in a semiconductor processing device with a camera according to an embodiment of the present invention includes taking a first picture of a first element by one or more cameras; providing a first actuator to move the first element an increment along a first direction; taking a second picture of the first element by the camera; and comparing the first picture and the second picture to calibrate the first element.

According to an embodiment of the method for calibrating element in a semiconductor processing device with a camera, wherein the step of comparing the first picture and the second picture further comprises determining features of the first element and measuring the features.

According to an embodiment of the method for calibrating element in a semiconductor processing device with a camera, wherein the first picture further comprises a second element, and wherein the second picture further comprises the second element.

According to an embodiment of the method for calibrating element in a semiconductor processing device with a camera, wherein the step of comparing the first picture and the second picture further comprises determining features of the first element and the second element and measuring angles or distances between the features of the first element and the features of the second element.

According to an embodiment of the present invention, the method for calibrating element in a semiconductor processing device with a camera further includes providing a second actuator to move the first element an increment along a second direction different from the first direction.

According to an embodiment of the method for calibrating element in a semiconductor processing device with a camera, wherein the first direction is normal to the second direction.

According to an embodiment of the present invention, the method for calibrating element in a semiconductor processing device with a camera further includes moving the first element a further increment along the first direction by the first actuator if a distance of a feature in the second picture is larger than a distance of the feature in the first picture.

According to an embodiment of the present invention, the method for calibrating element in a semiconductor processing device with a camera further includes moving the first element a increment along a reversed direction of the first direction by the first actuator if a distance of a feature in the second picture is smaller than a distance of the feature in the first picture.

According to an embodiment of the present invention, the method for calibrating element in a semiconductor processing device with a camera further includes moving the first element a further increment along the first direction by the first actuator if an angle of a feature in the second picture is smaller than an angle of the feature in the first picture.

According to an embodiment of the present invention, the method for calibrating element in a semiconductor processing device with a camera further includes moving the first element a increment along a reversed direction of the first direction by the first actuator if an angle of a feature in the second picture is larger than an angle of the feature in the first picture.

According to an embodiment of the present invention, the method for calibrating element in a semiconductor processing device with a camera further includes providing a laser to determine distances of features of the first element.

The system for calibrating element in a semiconductor processing device with a camera according to another embodiment of the present invention includes a camera, a first actuator, and a computing unit. The camera is used for taking pictures of a first element. The first actuator is used for moving the first element an increment along a first direction. The computing unit is used for recording the pictures and analyzing angles and distances of features of the first element in the pictures to produce a calibration message.

According to an embodiment of the present invention, the system for calibrating element in a semiconductor processing device with a camera further includes a second actuator used for moving the element an increment along a second direction.

According to an embodiment of the system for calibrating element in a semiconductor processing device with a camera, wherein the first direction is normal to the second direction.

According to an embodiment of the present invention, the system for calibrating element in a semiconductor processing device with a camera further includes a laser used to determine distances of these features of the first element.

According to an embodiment of the system for calibrating element in a semiconductor processing device with a camera, wherein the pictures include the first element and a second element in the semiconductor processing device.

According to an embodiment of the system for calibrating element in a semiconductor processing device with a camera, wherein the camera is normal to a support surface of the first element.

According to an embodiment of the present invention, the system for calibrating element in a semiconductor processing device with a camera further includes a light source used for lighting the first element.

By the step of providing a first actuator to move the first element an increment along a first direction and comparing the first picture and the second picture to calibrate the first element, the method for calibrating element according to an embodiment of the present invention can carry on calibration automatically and carry on calibration in vacuum environment and provide a simpler and more accurate calibrating method. By providing a camera used for taking pictures of a first element, a first actuator is used for moving the first element an increment along a first direction, and a computing unit used for recording the pictures and analyzing angles and distances of features of the first element in the pictures to produce a calibration message, the system for calibrating element according to an embodiment of the present invention can carry on calibration automatically and carry on calibration in vacuum environment and provide a simpler and more accurate calibrating system.

BRIEF DESCRIPTION OF THE DRAWINGS

The present invention will now be specified with reference to its preferred embodiment illustrated in the drawings, in which.

DESCRIPTION OF THE INVENTION

Figure 1:
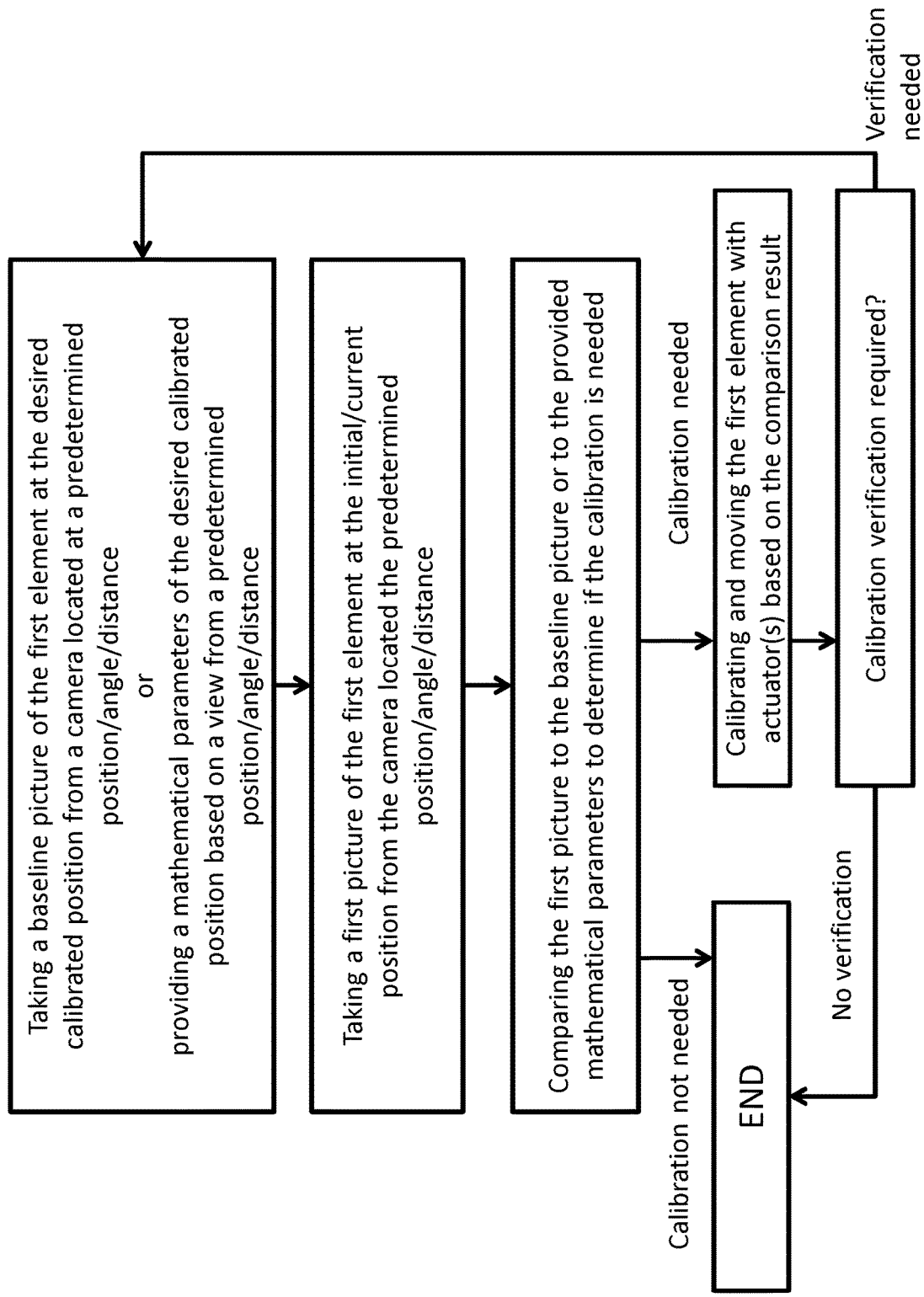
FIG. 1 is a schematic view of the steps of an embodiment of the present invention.

The embodiments of the invention will be described below with reference to the drawings. It should be understood that the specific embodiments described herein are merely illustrative of the invention and are not intended to limit the invention. The figures reveal some details. It should be understood that the details of the figures may be different from those that have been disclosed in words unless explicitly limiting the characteristics in specification.

In the description, it should be understood that the terms "longitudinal", "horizontal", "upper", "lower", "front", "rear", "left", "right", "Horizontal", "top", "bottom", "inside", "outside" and the like are based on the orientation or positional relationship shown in the drawings only for the purpose of describing the invention, it is not instructions or implied means that the device or element must have a specific orientation, constructed and operated in a particular orientation, and therefore it should not be construed as limiting the invention.

As shown in FIG. 1, according to an embodiment of the present invention, the present invention discloses a method for calibrating an element in a semiconductor processing device with a camera. In particular, the present invention provides a method for properly positioning the element at a predetermined position in the semiconductor processing device. The present invention provides a baseline picture taken from a camera located a predetermined/fixed position. Alternatively, mathematical parameter or a set of mathematical parameters can be used in lieu of a picture. Both the baseline picture and the mathematical parameters are representing and providing the information on where and how the element should be positioned. This baseline picture or mathematical information is stored in a computer readable storage medium in order for a central processing circuit to access for performing the comparison and any necessary calibration. The computer readable storage medium may contain a database for storing a plurality of baseline information for different elements and different semiconductor process devices.

Once the element is placed at its initial position within the semiconductor processing device, which the element can be placed under either atmosphere or vacuum condition. A first picture is taken for comparison. The central processing circuit will then compare the first picture against the baseline information and determine whether the element is positioned at the desired location/position or close to the desired location/position within an acceptable threshold. The present invention will not only check whether the element is placed at the designated location, it also checks whether the element is positioned with a desired geometrical orientation.

The semiconductor processing device and the element will have different physical features, such as holes, marking, indentation, or an overall shape. The central processing circuit will compare the relative position and arrangement as shown in both the baseline picture and the picture taken, and then determine whether it is necessary to proceed with the calibration. The comparison result can be comparing the distance between two or more physical features as shown in the baseline picture and the picture taken. The comparison result can also be examining whether there is any distortion on the overall shape of the element as shown in the picture taken, which in particularly is useful to inspect the geometric orientation. Based on the compared result, the central processing circuit then determines whether any found difference is within a tolerable threshold. The central processing circuit then calculates the necessary movement for the actuator to move the element. Alternatively, the information represented by the baseline picture can also be represented in a form of mathematical parameters.

If the element is not placed at the desired location/position, the present invention will calculate the desired movement based on the identified difference between the baseline information and the picture taken. The central processing circuit will then instruct the actuator to move the element for calibration. If the central processing circuit determines that the deviation cannot be adjusted based on the equipped actuators, the central processing circuit will notify the operator whether to proceed to remove the element and re-position the element into the semiconductor processing device again.

Once the adjustment is completed, the system can optionally repeat the calibration process for verifying whether the calibration has been completed successfully, or it is necessary to re-calibrate it again if the calibrating result is not within the tolerable threshold. Since the present invention utilizes a picture/image for determining any deviation, the higher resolution the camera is capable of, the higher accuracy it can provide.

Figure 2:
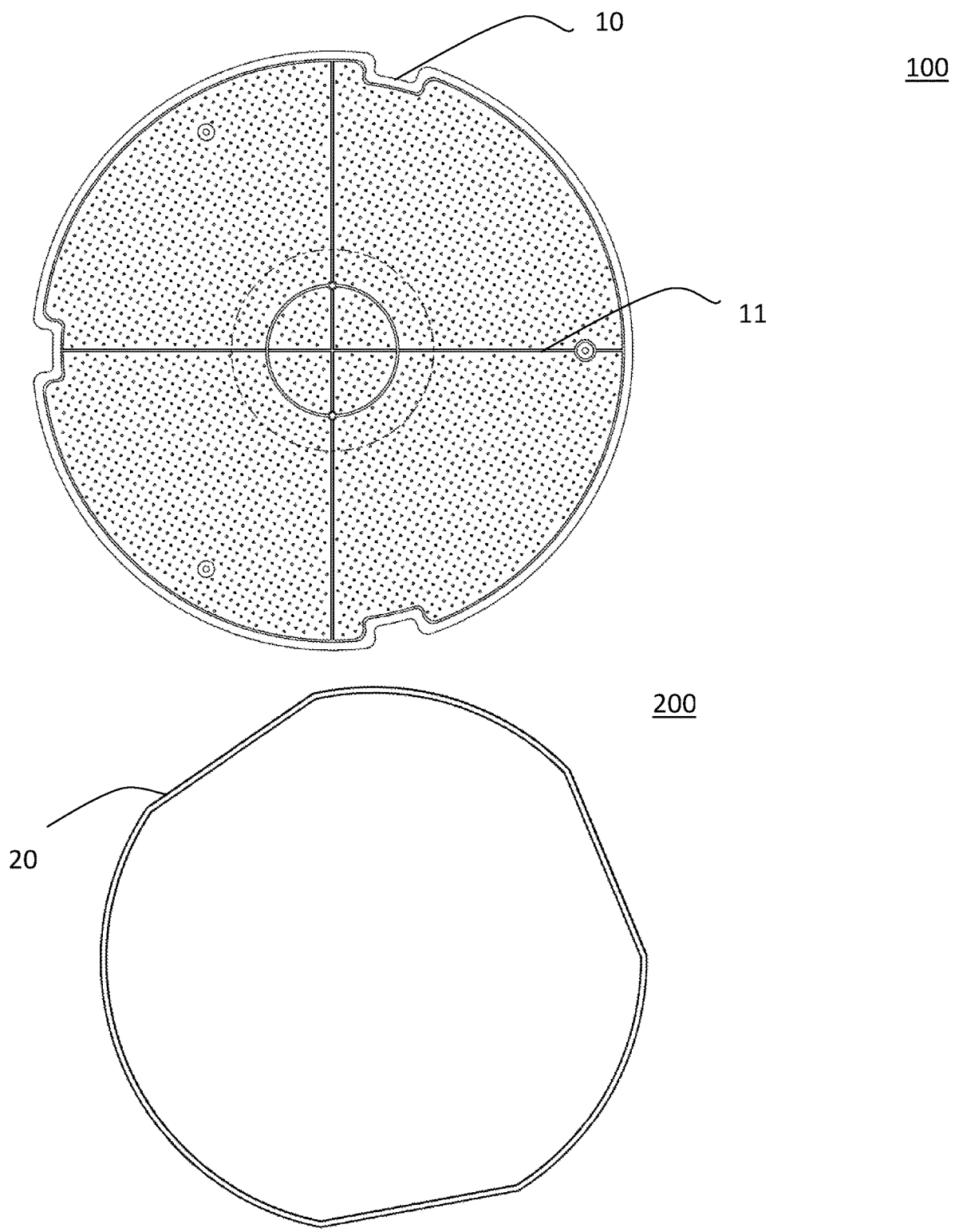
FIG. 2 is a schematic view of example of features of the first element of an embodiment of the present invention.
Figure 3:
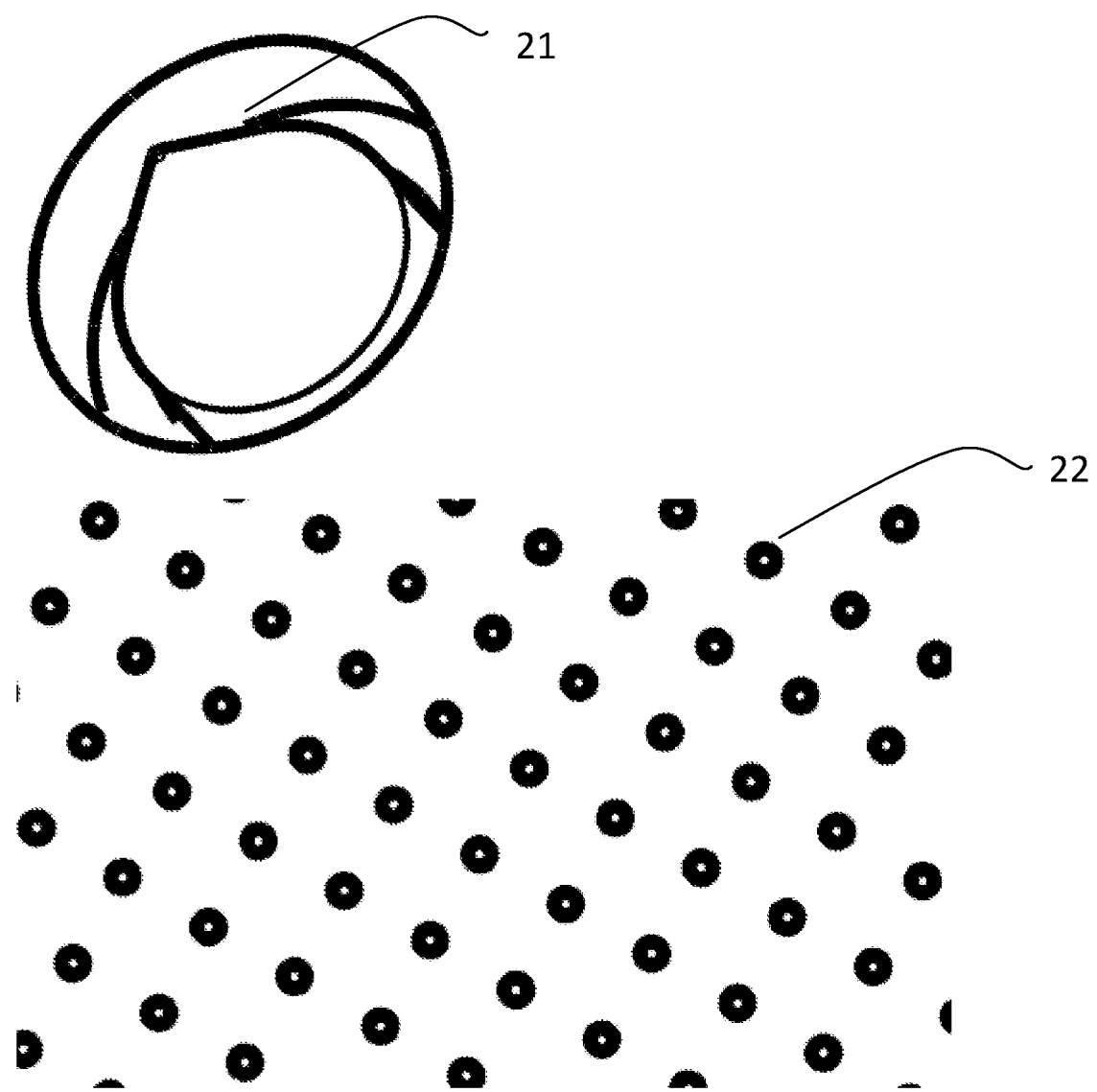
FIG. 3 is a schematic view of other example of features of the first element of an embodiment of the present invention.

According to an embodiment of the method for calibrating element in a semiconductor processing device with a camera, wherein the step of comparing the first picture and the second picture further comprises determining features of the first element and measuring the features. Referring to FIG. 2, for example, a round type e-chuck 100 has features of notch 10, and groove line 11. A cut-edge type e-chuck 200 has features edge line 20. Referring to FIG. 3, for example, a lift pin 21 in e-chuck or gas holes 22 in e-chuck may take as features for calibration.

Figure 4:
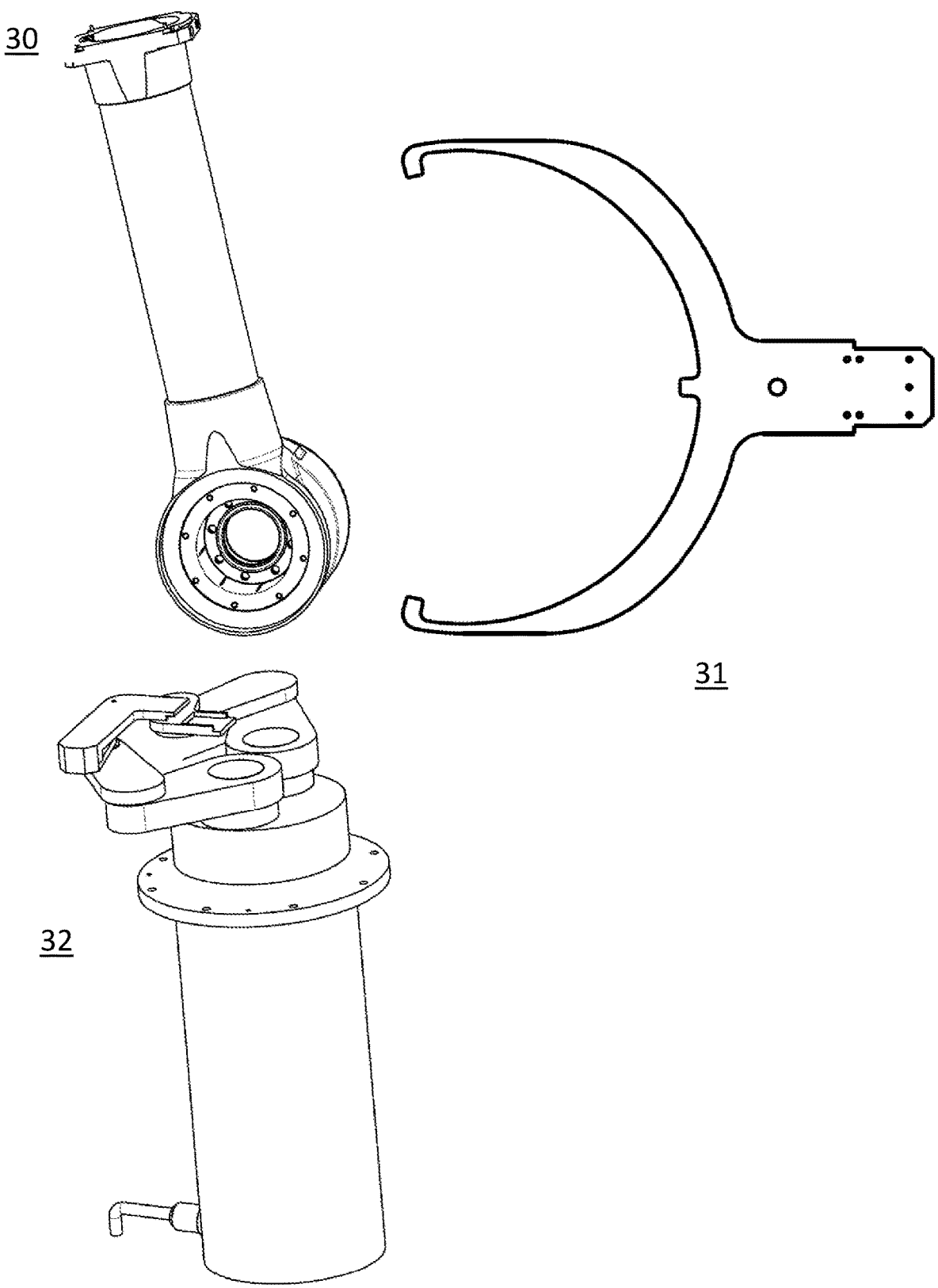
FIG. 4 is a schematic view of example of the second element of an embodiment of the present invention.

According to an embodiment of the method for calibrating element in a semiconductor processing device with a camera, wherein the first picture further comprises a second element, and wherein the second picture further comprises the second element. Referring to FIG. 4, for example, the first element is e-chuck and the second element may be other hardware inside chamber such as chamber wall, arm 30, 31, or robot 32. These embodiments of the present invention do not need to limit the type of the first element and the second element.

According to an embodiment of the method for calibrating element in a semiconductor processing device with a camera, wherein the step of comparing the first picture and the second picture further comprises that determining features of the first element and the second element and measuring angles or distances between the features of the first element and the features of the second element.

According to an embodiment of the present invention, the method for calibrating element in a semiconductor processing device with a camera further includes providing a second actuator to move the first element an increment along a second direction different from the first direction.

According to an embodiment of the method for calibrating element in a semiconductor processing device with a camera, wherein the first direction is normal to the second direction. For example, the first direction is rotated about the axial direction of the first element, that's the twist of the first element. And the second direction is rotated about the axis e perpendicular to the axial direction of the first element, that's the tilt of the first element.

Figure 5A:
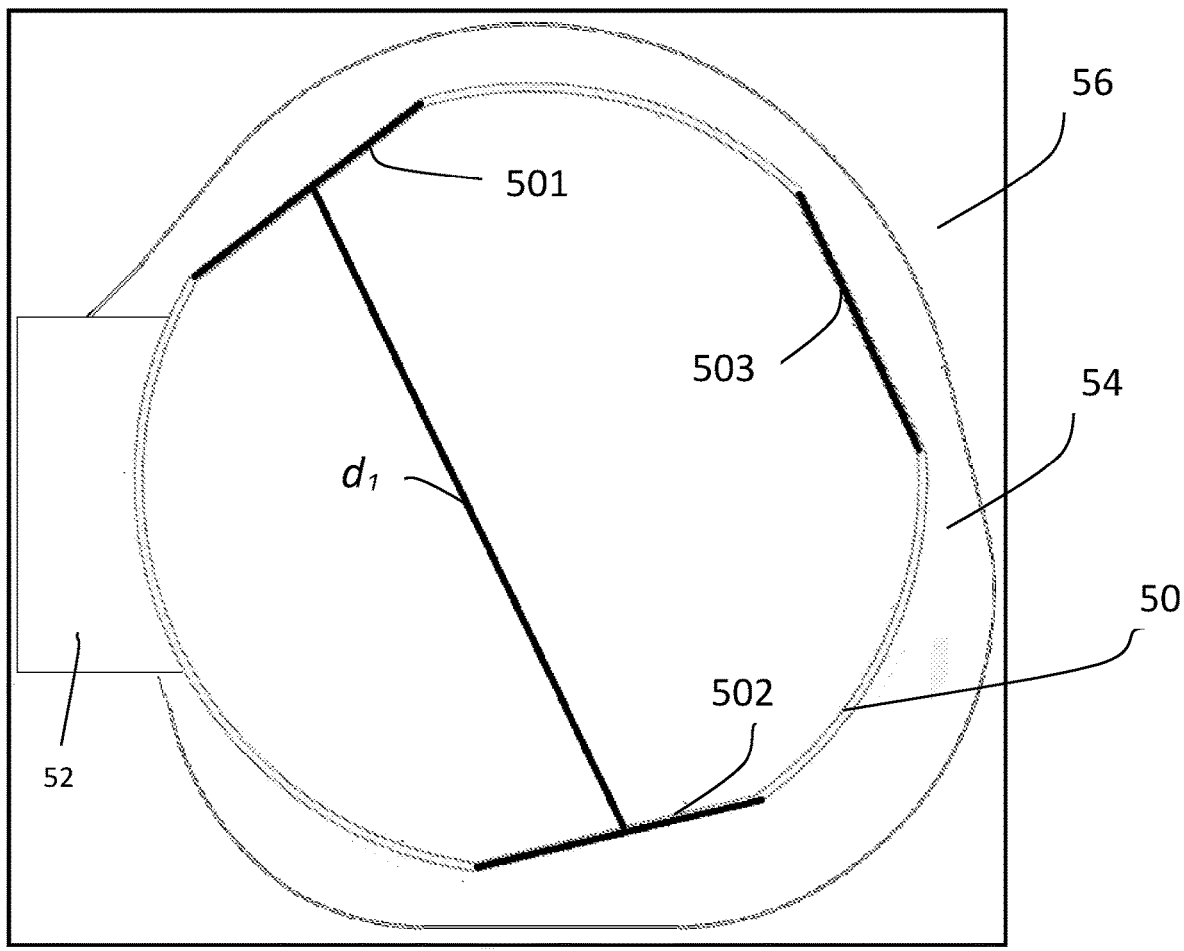
FIGS. 5A-B are a schematic view of measuring the distance of a feature in an embodiment of the present invention.
Figure 5B:
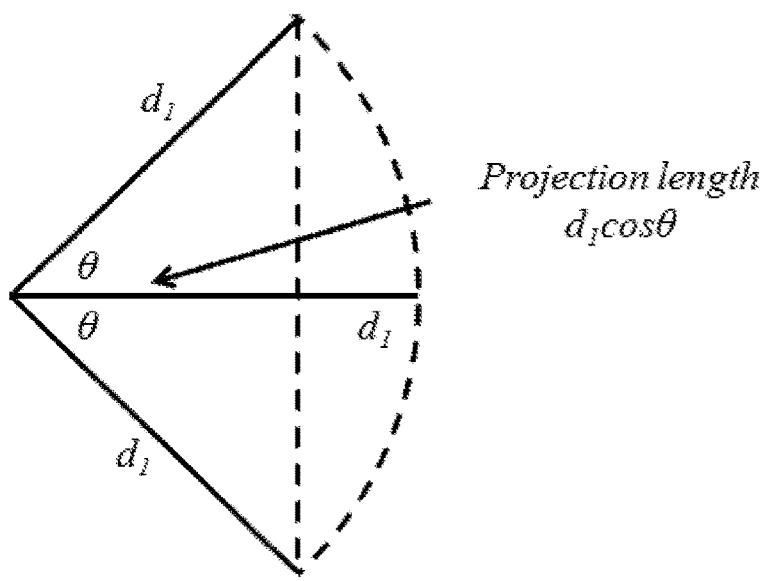

According to an embodiment of the present invention, the method for calibrating element in a semiconductor processing device with a camera further includes moving the first element a further increment along the first direction by the first actuator if a distance of a feature in the second picture is larger than a distance of a feature in the first picture. As shown in FIG. 5A, an e-chuck 50 located within a chamber 56 is illuminated by a light source 54 from the backside. The e-chuck 50 connecting to support structure 52 comprises cutting edges 501, 502, and 503. Depending on the actual need, the projection length dl could be defined as a connecting line between midpoints of any two cutting edges of the e-chuck 50. Referring to FIGS. 5A-B, for example, in e-chuck tilt adjusting, projection length of dl will be a maximum when e-chuck is in ideal horizontal position. If a distance of a feature in the second picture is larger than a distance of a feature in the first picture, moving the first element a further increment along the first direction by the first actuator may be moving the first element to a more horizontal position.

Similarly, according to an embodiment of the present invention, the method for calibrating element in a semiconductor processing device with a camera further includes moving the first element a increment along a reversed direction of the first direction by the first actuator if a distance of a feature in the second picture is smaller than a distance of the feature in the first picture.

Figure 6:
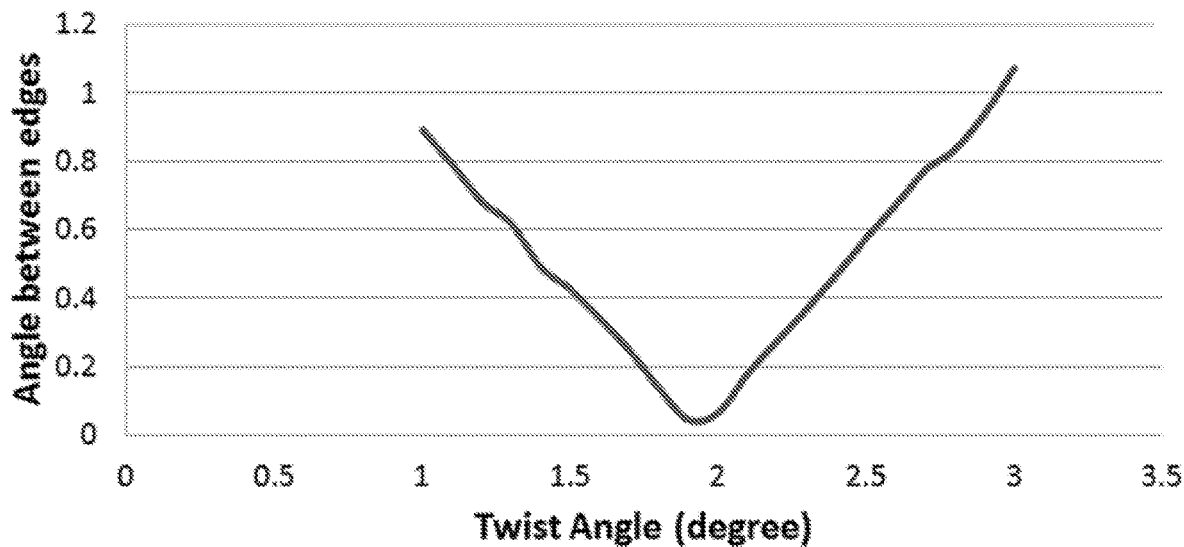
FIG. 6 is a schematic view of diagram of twist angle vs. angle between edges of an embodiment of the present invention.

According to an embodiment of the present invention, the method for calibrating element in a semiconductor processing device with a camera further includes moving the first element a further increment along the first direction by the first actuator if an angle of a feature in the second picture is smaller than an angle of the feature in the first picture. Referring to FIG. 6, for example, in e-chuck twist adjusting, one can get the calibration factor at the inflection point of the curve of angles. Angles between edges of first element and second element will be a minimum when first element is in ideal position. So, if an angle of a feature in the second picture is smaller than an angle of the feature in the first picture, moving the first element a further increment along the first direction by the first actuator may be moving the first element to a more ideal position. Similarly, the relationship between measured distance and desired distance between element features can be represented in such graph. The central computer readable medium can have a database to store a plurality of previously calculated data for calibration purpose; or the central processing circuit can calculate the adjustment at time of the calibration.

Similarly, according to an embodiment of the present invention, the method for calibrating element in a semiconductor processing device with a camera further includes moving the first element a increment along a reversed direction of the first direction by the first actuator if an angle of a feature in the second picture is larger than an angle of the feature in the first picture.

Figure 7:
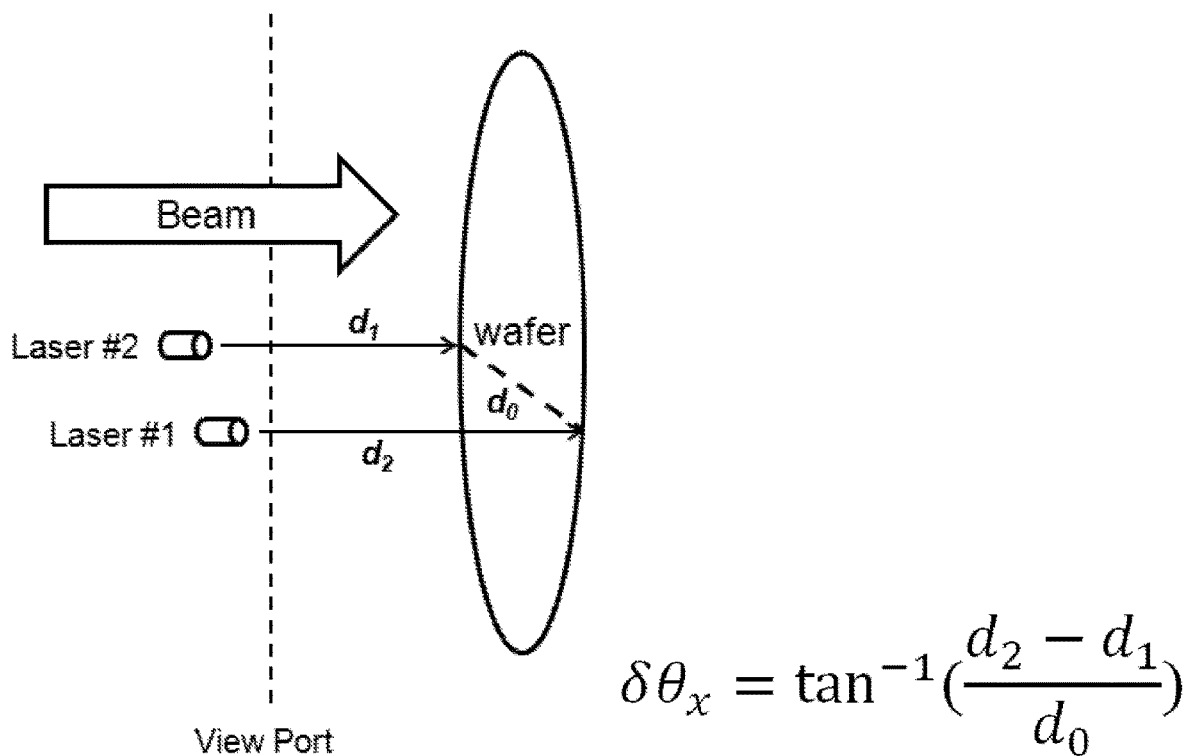
FIG. 7 is a schematic view of detecting distance by lasers of an embodiment of the present invention.

As shown in FIG. 7, according to an embodiment of the present invention, the method for calibrating element in a semiconductor processing device with a camera further includes providing lasers #1, #2 to determine distances of features of the first element (in FIG. 7, for example, a wafer).

Figure 8:
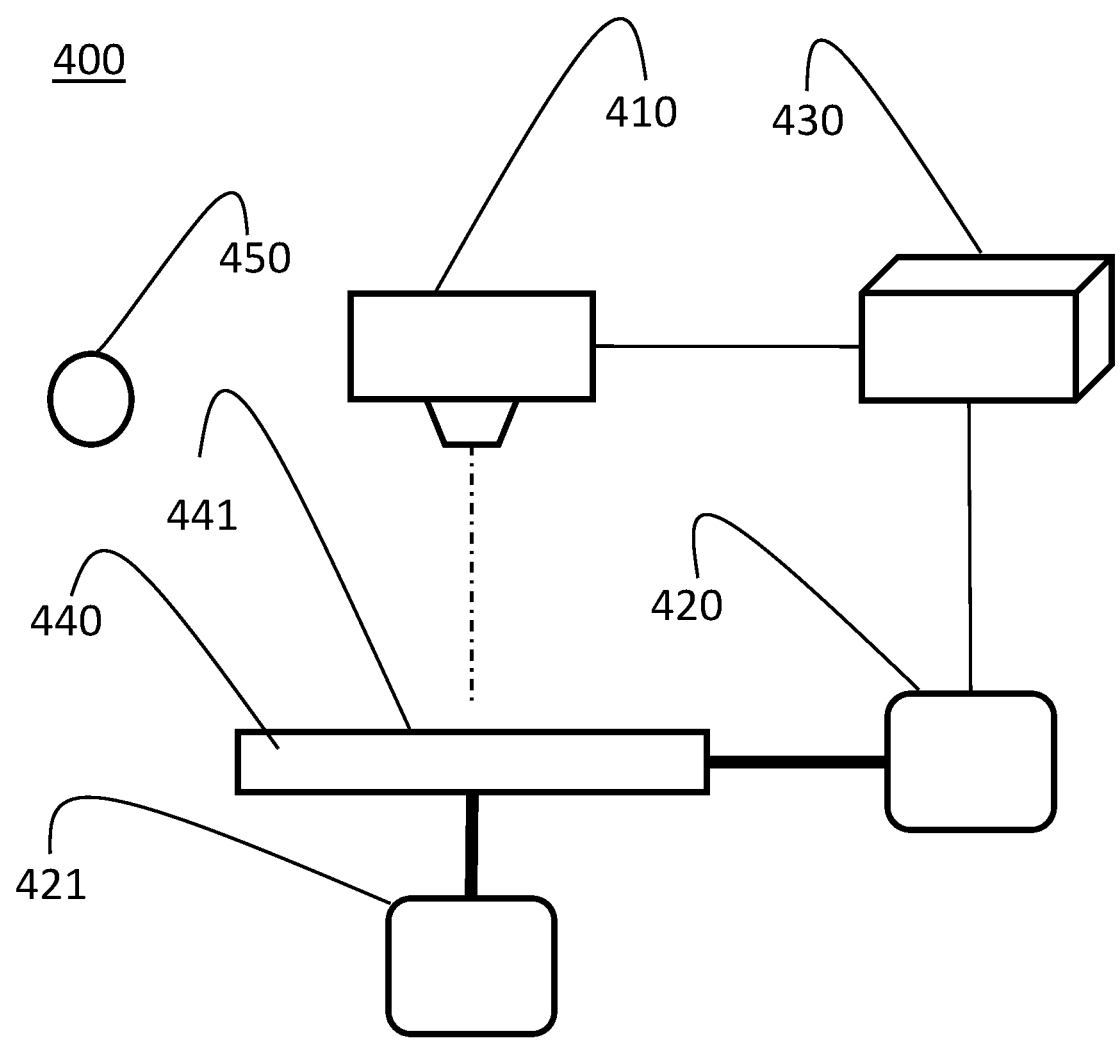
FIG. 8 is a schematic view of system for calibrating element in a semiconductor processing device with a camera of an embodiment of the present invention.

As shown in FIG. 8, the system 400 for calibrating element in a semiconductor processing device with a camera according to another embodiment of the present invention includes a camera 410, a first actuator 420, and a computing unit 430. The camera 410 is used for taking pictures of a first element 440. The first actuator 420 is used for moving the first element 440 an increment along a first direction. The computing unit 430 is used for recording the pictures and analyzing angles and distances of features of the first element 440 in the pictures to produce a calibration message.

As shown in FIG. 8, according to an embodiment of the present invention, the system for calibrating element in a semiconductor processing device with a camera further includes a second actuator 421 used for moving the element an increment along a second direction.

According to an embodiment of the system for calibrating element in a semiconductor processing device with a camera, wherein the first direction is normal to the second direction.

As shown in FIG. 7, according to an embodiment of the present invention, the system for calibrating element in a semiconductor processing device further uses a laser in lieu of the camera for determining distances of these features of the first element.

According to an embodiment of the system for calibrating element in a semiconductor processing device with a camera, wherein the pictures include the first element and a second element in the semiconductor processing device. As shown in FIG. 4, for example, the first element is e-chuck and the second element may be other hardware inside chamber such as chamber wall, arm 30, 31, or robot 32. These embodiments of the present invention do not need to limit the type of the first element and the second element.

According to an embodiment of the system for calibrating element in a semiconductor processing device with a camera, wherein the camera 410 is normal to a support surface 441 of the first element 440.

According to an embodiment of the present invention, the system for calibrating element in a semiconductor processing device with a camera further includes a light source 450 used for lighting the first element 440.

By the step of providing a first actuator to move the first element an increment along a first direction and comparing the first picture and the second picture to calibrate the first element, the method for calibrating element according to an embodiment of the present invention can carry on calibration automatically and carry on calibration in vacuum environment and provide a simpler and more accurate calibrating method. By providing a camera used for taking pictures of a first element, a first actuator is used for moving the first element an increment along a first direction, and a computing unit used for recording the pictures and analyzing angles and distances of features of the first element in the pictures to produce a calibration message, the system for calibrating element according to an embodiment of the present invention can carry on calibration automatically and carry on calibration in vacuum environment and provide a simpler and more accurate calibrating system.

The above description is a preferred embodiment of the invention and it should be noted that it will be apparent to those skilled in the art that a number of improvements and modifications may be made without departing from the principles of the invention. These improvements and modifications also regarded as the scope of protection of the invention.

What is claimed is:

1. A method for calibrating a tilting angle or a twisting angle of a first element into a designated position in a semiconductor processing device with a camera, comprising:

providing a designated position data of said first element;

placing said first element into the said semiconductor processing device at a current position;

taking a current position picture of said first element by said camera;

deriving a current position data according to said current position picture;

comparing an angle between edges or a length of a feature of said first element in said designated position data and a respective angle between edges or length of a feature of said first element in said current position data for identifying a position discrepancy between said designated position data and said current position data; and calibrating said first element to said designated position according to said position discrepancy by determining a corresponding adjustment for said first element for respectively twisting said first element to minimize said angle between edges or moving said first element incrementally until said length of said feature is maximized within a predetermined tolerance.

2. A system for calibrating a tilting angle or a twisting angle of a first element into a designed position in a semiconductor processing device with a camera, comprising:

a camera for obtaining a designated position picture and a current position picture of said first element;

a first actuator used for moving said first element along a first direction; and a computing unit used for recording said designated position picture and said current position picture, and analyzing angles and distances of features of said first element in said designated position picture and said current position picture to produce a calibration message;

wherein said computing unit derives a designated position data from said designated position picture, and derives a current position data from said current position picture;

wherein said computing unit compares an angle between edges or a length of a feature of said first element in said designated position data and a respective angle between edges or a length of a feature of said first element in said current position data for identifying a position discrepancy between said designated position data and said current position data to produce said calibration message; and wherein said system calibrates said first element to said designated position according to said position discrepancy by determining a corresponding adjustment for said first element for respectively twisting said first element to minimize said angle between edges or moving said first element incrementally until said length of said feature is maximized within a predetermined tolerance.

3. The system for calibrating the tilting angle or the twisting angle of the first element into the designated position in the semiconductor processing device with a camera of claim 2, further comprising a second actuator used for moving said element an increment along a second direction.

4. The system for calibrating the tilting angle or the twisting angle of the first element into the designated position in the semiconductor processing device with a camera of claim 3, wherein said first direction is normal to said second direction.

5. The system for calibrating the tilting angle or the twisting angle of the first element into the designated position in the semiconductor processing device with a camera of claim 2, wherein said pictures include said first element and a second element in said semiconductor processing device.

6. The system for calibrating the tilting angle or the twisting angle of the first element into the designated position in the semiconductor processing device with a camera of claim 2, wherein said camera is normal to a support surface of said first element.

7. The system for calibrating the tilting angle or the twisting angle of the first element into the designated position in the semiconductor processing device with a camera of claim 2, further comprising a light source used for lighting said first element.

8. The method for calibrating the tilting angle or the twisting angle of the first element in the semiconductor processing device of claim 1, wherein the first element is a non-cyclical element.

9. The method for calibrating the tilting angle or the twisting angle of the first element in the semiconductor processing device of claim 1, wherein the first element is an e-chuck, a wafer, an end effector, a robot, or an arm.

10. The method for calibrating the tilting angle or the twisting angle of the first element in the semiconductor processing device of claim 1, wherein both said current position data and said designated position data are relative positions of said first element from said camera.

11. The method for calibrating the tilting angle or the twisting angle of the first element in the semiconductor processing device of claim 1, wherein said step of providing a said designated position data of said first element comprises taking a designated position picture of said first element at said designated position.

12. The method for calibrating the tilting angle or the twisting angle of the first element in the semiconductor processing device of claim 11, wherein said designated position data is stored in a computing unit, and said first element comprises a first physical feature.

13. The method for calibrating the tilting angle or the twisting angle of the first element in the semiconductor processing device of claim 12, wherein said first physical feature is a hole, an indentation, a marking, a notch, a groove line, an edge line, a lift pin, a gas hole, or an overall shape.

14. The method for calibrating the tilting angle or the twisting angle of the first element in the semiconductor processing device of claim 12, wherein said step of comparing said designated position data and said current position data comprises comparing said first physical feature shown in said designated position picture to said first physical feature shown in said current position picture, and determines whether said position discrepancy exceeds a threshold.

15. The method for calibrating the tilting angle or the twisting angle of the first element in the semiconductor processing device of claim 1, wherein said step of providing said designated position data of said first element comprises taking a designated position picture of said first element at said designated position along with a second element, and said step of taking said current position picture comprises take said current position picture of said first element alone with said second element.

16. The method for calibrating the tilting angle or the twisting angle of the first element in the semiconductor processing device of claim 15, wherein said second element is a chamber wall, an end effector, a robot, or an arm.

17. The method for calibrating the tilt or twist of the first element in the semiconductor processing device of claim 16, wherein both said current position data and said designated position data are relative positions of said first element from said second element, and said step of comparing said designated position data and said current position data comprises comparing said relative position shown in said designated position picture to said relative position shown in said current position picture.

18. The method for calibrating the tilting angle or the twisting angle of the first element in the semiconductor processing device of claim 17, wherein said relative positions are an angle or a distance.

19. The method for calibrating the tilting angle or the twisting angle of the first element in the semiconductor processing device of claim 1, wherein said designated position data is a set of designated mathematic parameters.

20. A method for calibrating a tilting angle or a twisting angle a first element into a designated position in a semiconductor processing device, comprising:
providing a designated position data of said first element;
placing said first element into the said semiconductor processing device at a current position;
deriving a current position data;
comparing said designated position data and said current position data for identifying a position discrepancy between said designated position data and said current position data; and
calibrating said first element into said designated position according to said position discrepancy;
wherein said designated position data comprises a first designated distance and a second designated distance from at least one measuring device to a plane of the first element.

21. The method for calibrating the tilting angle or the twisting angle of the first element in the semiconductor processing device of claim 20, wherein said step of deriving said current position data comprises deriving a first current distance and a second current distance from said measuring device to the plane of the first element.

22. The method for calibrating the tilting angle or the twisting angle of the first element in the semiconductor processing device of claim 21, wherein said step of comparing said designated position data and said current position data comprises comparing said first current distance to said first designated distance, and comparing said second current distance to said second designated distance.

23. The method for calibrating the tilting angle or the twisting angle of the first element in the semiconductor processing device of claim 1, further comprising providing an adjusting mechanism to move said first element along a linear path from said current position to said designated position.

24. The method for calibrating the tilting angle or the twisting angle of the first element in the semiconductor processing device of claim 1, further comprising providing an adjusting mechanism to rotate said first element from said current position to said designated position.

25. A method for calibrating the position of a first element in a semiconductor processing device with a camera, comprising:
providing a designated position data of said first element;
placing said first element into said semiconductor processing device at a current position;
taking a current position picture of said first element by said camera;
deriving a current position data according to said current position picture;
comparing a length of a feature of said first element in said designated position data and a length of a feature of said first element in said current position data to identify a position discrepancy between said designated position data and said current position data; and
calibrating a horizontal position of said first element to an ideal horizontal position according to said position discrepancy by using a first actuator to move said first element incrementally in a first direction until said length of said feature is maximized within a predetermined tolerance.

26. A method for calibrating the position of a first element in a semiconductor processing device with a camera, comprising:
providing a designated position data of said first element;
placing said first element into said semiconductor processing device at a current position;
taking a current position picture of said first element by said camera;
deriving a current position data according to said current position picture;
comparing an angle between edges of said first element in said designated position data and an angle between edges of said first element in said current position data to identify a position discrepancy between said designated position data and said current position data; and calibrating said first element to said designated position according to said position discrepancy by determining an adjustment for said first element based on said position discrepancy for correspondingly adjusting a twist angle of said first element to minimize said angle between edges.

27. The method for calibrating the tilting angle or the twisting angle of the first element in the semiconductor processing device of claim 20, wherein said measuring device is a laser emitter for determining the first current distance and the second current distance.

28. The method for calibrating the tilting angle or the twisting angle of the first element in the semiconductor processing device of claim 21, wherein said designated position data further comprises a third designated distance between a first measuring device and a second measuring device.

29. The method for calibrating the tilting angle or the twisting angle of the first element in the semiconductor processing device of claim 28, wherein an angle is measured by a formula of $\tan^{-1}((\text{said second current distance} - \text{said first current distance})/\text{said third designated distance})$.

* * * * *